United States Patent [19]

Talreja et al.

[11] Patent Number: 5,267,196
[45] Date of Patent: Nov. 30, 1993

[54] FLOATING GATE NONVOLATILE MEMORY WITH DISTRIBUTED BLOCKING FEATURE

[75] Inventors: Sanjay S. Talreja, Citrus Heights; Peter K. Hazen, Sacramento; Sherif R. B. Sweha, El Dorado Hills, all of Calif.

[73] Assignee: Intel Corporation, Santa Clara, Calif.

[21] Appl. No.: 901,279

[22] Filed: Jun. 19, 1992

[51] Int. Cl.$^5$ .............................................. G11C 17/00
[52] U.S. Cl. .............................. 365/185; 365/230.03; 365/218; 365/189.01
[58] Field of Search ................... 365/230.03, 185, 184, 365/218, 238.5, 230.04, 230.06, 231, 189.08

[56] References Cited

U.S. PATENT DOCUMENTS

| | | | |
|---|---|---|---|
| 4,849,943 | 7/1989 | Pfennings | 365/230.03 |
| 4,939,696 | 7/1990 | Katsuo et al. | 365/230.03 |
| 4,958,326 | 9/1990 | Sakurai | 365/218 |
| 4,961,164 | 10/1990 | Miyoaka et al. | 365/230.03 |
| 4,967,399 | 10/1990 | Kuwabara et al. | 365/230.06 |
| 4,972,378 | 11/1990 | Kitagawa et al. | 365/185 |
| 4,977,538 | 12/1990 | Anami et al. | 365/230.03 |
| 5,065,364 | 11/1991 | Atwood et al. | 365/218 |

*Primary Examiner*—Eugene R. LaRoche
*Assistant Examiner*—Vu A. Le
*Attorney, Agent, or Firm*—Blakely, Sokoloff, Taylor & Zafman

[57] ABSTRACT

A nonvolatile memory device residing on a substrate is described. The memory device includes a first block and a second block. The first block includes a first sub-block comprising a first memory cell, a first bit line coupled to a drain of the first memory cell, and a first source line coupled to a source of the first memory cell. The first block also includes a second sub-block which includes a second memory cell, a second bit line coupled to a drain of the second memory cell, and a second source line coupled to a source of the second memory cell. The second block comprises a third sub-block comprising a third memory cell, a third bit line coupled to a drain of the third memory cell, and a third source line coupled to a source of the third memory cell. The second block also includes a fourth sub-block which includes a fourth memory cell, a fourth bit line coupled to a drain of the fourth memory cell, and a fourth source line coupled to a source of the fourth memory cell. The first sub-block of the first block and the third sub-block of the second block are grouped together on the substrate to form a first data bit group corresponding to a first data pin of the memory device such that the distances of the first and third memory cells of the first data bit group to a first sensing circuit are substantially minimized and are substantially equal. The second sub-block of the first block and the fourth sub-block of the second block are grouped together on the substrate to form a second data bit group corresponding to a second data pin of the memory device such that the distances of the second and fourth memory cells of the second data bit group to a second sensing circuit are substantially minimized and are substantially equal.

19 Claims, 5 Drawing Sheets

FIG. 5

FLOATING GATE NONVOLATILE MEMORY WITH DISTRIBUTED BLOCKING FEATURE

FIELD OF THE INVENTION

The present invention pertains to the field of computer memories. More particularly, this invention relates to a floating gate nonvolatile memory with distributed blocking feature, wherein memory columns of different blocks corresponding to a data pin are physically grouped together to form a data bit group such that the lengths of the bit lines within one data bit group to their common sense amplifier are substantially minimized and are substantially equal.

BACKGROUND OF THE INVENTION

A typical flash erasable and electrically programmable read-only memory ("flash EPROM") is organized into rows and columns. Memory cells are placed at intersections of word lines and bit lines. Each word line is connected to the gates of a plurality of memory cells in one row. Each bit line is connected to the drains of a plurality of memory cells in one column. The sources of all the memory cells are connected to a common source line. The flash EPROM can be programmed, and once programmed, the entire contents of the flash EPROM can be erased by electrical erasure. A high erasing voltage $V_{PP}$ is made available to the source of all the cells simultaneously. This results in a full array erasure. The flash EPROM may then be programmed with new data.

One disadvantage of this prior flash EPROM structure is the characteristics of array erasure. When changes are sought to be made to a program stored in the array, the entire array must be erased and the entire program be rewritten into the array, even when the changes are minor.

One prior approach to solving this problem is to reorganize the array into blocks so that the high erasing voltage is made available only to the source of every cell within one block to be erased. By this arrangement, only a block of memory array is erased, rather than having the entire memory array erased.

Figure 1:
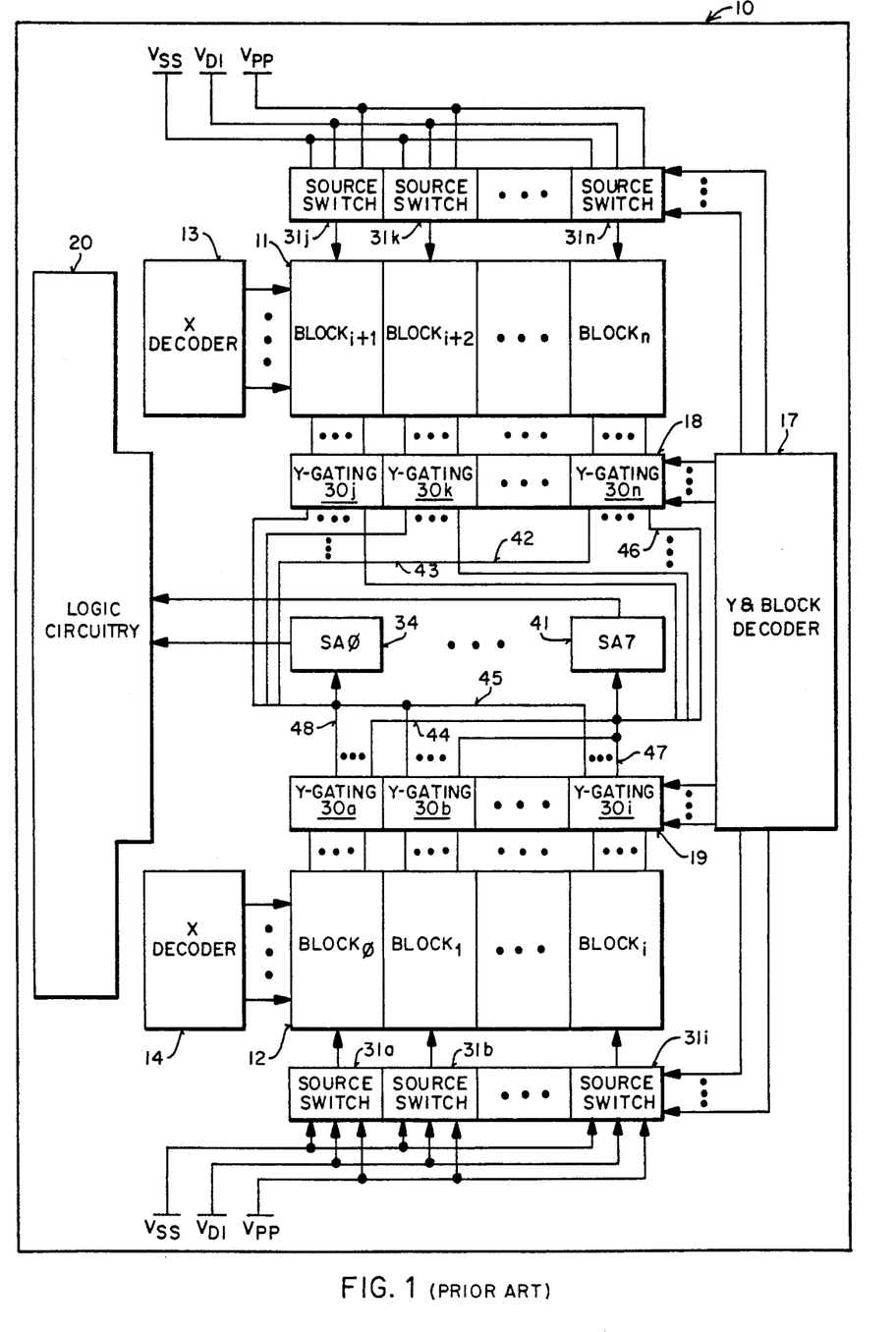
FIG. 1 is a physical layout block diagram of a prior flash EPROM that is organized into blocks, wherein columns of memory cells corresponding to a data pin are distributed over all memory blocks of the prior flash EPROM.

FIG. 1 illustrates such a typical prior arrangement. In FIG. 1, memory cells of prior flash EPROM 10 are organized into a plurality of bit line blocks BLOCKo through BLOCKn. Each block can be individually addressed for read, programming, and erasure operations. Each block includes a plurality of bit lines that are connected to eight sense amplifiers 34 through 41 via a respective one of Y gating circuits 30a through 30n. Each of Y gating circuits 30a-30n includes a plurality of column select transistors for selectively connecting eight bit lines (i.e., one byte) at a time from the respective block to sense amplifiers 34-41. Therefore, each of Y gating circuits 30a-30n includes eight connection lines connected to sense amplifiers 34-41, respectively. For example, Y gating circuit 30a has a connection line 48 connected to sense amplifier 34. Y gating circuit 30n has a connection line 42 connected to sense amplifier 34. The outputs of sense amplifiers 34-41 are coupled to data pins of the prior flash EPROM via output buffers of logic circuitry 20. Prior flash EPROM 10 also includes a plurality source switches 31a through 31n, each associated with one of blocks BLOCKo through BLOCKn.

During the read operation, a Y and block decoder 17 selects one byte of bit lines in a selected block for any given address applied. The selected bit lines are then connected to sense amplifiers 34-41 via the associative connection lines. One of X decoders 13 and 14 selects a word line. Sense amplifiers 34-41 then sense the voltage levels on the selected bit lines to obtain data from the selected memory cells at intersections of the selected bit lines and the selected word line. Sense amplifiers 34-41 then apply the sensed data to the data pins of prior flash EPROM 10 via logic circuitry 20.

During the programming operation, decoder 17 selects one byte of bit lines in a selected block for each address applied. One of the X decoders 13-14 selects a word line. Programming potentials are applied to the selected bit lines and the selected word line. Decoder 17 selects the source switch associated with the selected block to couple a ground potential $V_{SS}$ to the sources of the memory cells of the selected block. Meanwhile, decoder 17 causes the source switches associated with the unselected blocks to couple a disturb inhibit potential $V_{DI}$ to the sources of the memory cells of the unselected blocks. This is done to help prevent the programming of the selected cells in the selected block from disturbing the memory cells in unselected blocks. During the erasure operation, decoder 17 selects one block by selecting its associative source switch for each address applied. The selected source switch applies the high erasure voltage $V_{PP}$ to the sources of the memory cells of the selected block, thus allowing block erasure of the selected block.

Disadvantages are, however, associated with this prior blocked flash EPROM structure. One disadvantage is that relatively longer connection lines are required to couple memory cells distributed in different blocks to their common sense amplifier. For example, connection line 42 from Y gating circuit 30n for BLOCKn to sense amplifier 34 is typically relatively long. Similarly, lines 43 through 45 are typically relatively long. This typically introduces more line resistance and line capacitance to the selected bit lines which typically results in the increase of charging time of the newly selected bit lines. This typically causes the total access time of the prior flash EPROM to be relatively long. In addition, these long connection lines typically require more space on the memory chip.

Another disadvantage is that the line resistance and line capacitance varies significantly from one connection line of one block to another connection line of another block with respect to their common sense amplifier when the die size of the prior flash EPROM increases and more blocks are included to increase the storage capacity. The increase in the die size of the prior flash EPROM typically causes the distance of one block to one sense amplifier to be much longer than that of another block to the same sense amplifier. For example, connection line 42 from Y gating circuit 30n to sense amplifier 34 is typically much longer than connection line 48 from Y gating circuit 30a. Connection line 43 from Y gating circuit 30j to sense amplifier 41 is typically much longer than connection line 47 from Y gating circuit 30i to sense amplifier 41. This typically introduces noise to the signals coupled to sense amplifiers 34-41 via the connection lines. The noise may cause sense amplifiers 34-41 to read wrong data. In addition, the connection lines are typically crossed with each other on the memory chip in order to reach their respective sense amplifiers. The line crossing also brings noise to the signals transmitted on the connection lines.

Another disadvantage is that during erasing of a block, some of the memory cells of the block tend to absorb more erasure current than others. This is typically referred to as current "hogging". Current hogging typically arises when, during erasing, some memory cells enter the "Zener breakdown" state while others do not. When a cell is in the Zener breakdown state, a slight voltage increase on the source may lead to a significant increase in current flow through the cell, and vice versa. When the erasing voltage along the common source line of a block varies from point to point, the voltage variations may cause the cells coupled at some point of the source line that are in the Zener breakdown state to sink most of the erasure current. The voltage variations along a source line are typically relatively significant when the memory are relatively large and contain a relatively large number of memory cells. This typically requires the source line to be long in order to connect to the sources of all memory cells of the block. The relatively long source line typically increases the line impedance, which in turn results in voltage variations along the source line being relatively significant.

SUMMARY AND OBJECTS OF THE INVENTION

One of the objects of the present invention is to provide a nonvolatile memory that is organized into blocks, wherein the lengths of all the bit lines within each block to their respective sense amplifiers are substantially minimized and are substantially equal such that the access time of the memory is improved.

Another object of the present invention is to provide a nonvolatile memory that is organized into blocks, wherein noise interference to each sense amplifier is minimized.

Another object of the present invention is to provide a nonvolatile memory that is organized into blocks, wherein current hogging of memory cells in a block during erasing is minimized and better erasure characteristics are obtained.

A nonvolatile memory device residing on a substrate is described. The memory device includes a first block and a second block. The first block includes a first sub-block associated with a first data pin of the memory device and comprising a first memory cell, a first bit line coupled to a drain of the first memory cell, and a first source line coupled to a source of the first memory cell. The first block also includes a second sub-block associated with a second data pin of the memory device. The second sub-block includes a second memory cell, a second bit line coupled to a drain of the second memory cell, and a second source line coupled to a source of the second memory cell. The second block comprises a third sub-block associated with the first data pin and comprising a third memory cell, a third bit line coupled to a drain of the third memory cell, and a third source line coupled to a source of the third memory cell. The second block also includes a fourth sub-block associated with the second data pin. The fourth sub-block includes a fourth memory cell, a fourth bit line coupled to a drain of the fourth memory cell, and a fourth source line coupled to a source of the fourth memory cell. The first sub-block of the first block and the third sub-block of the second block are grouped together on the substrate to form a first data bit group corresponding to the first data pin. The second sub-block of the first block and the fourth sub-block of the second block are grouped together on the substrate to form a second data bit group corresponding to the second data pin. A word line is coupled to control gates of the first, second, third, and fourth memory cells. A first sensing circuit is coupled to the first and third bit lines of the first data bit group for detecting voltage level on a selected one of the first and third bit lines and for applying the detected voltage level to the first data pin. The distances of the first sensing circuit to the first and third memory cells are substantially minimized and are substantially equal. A second sensing circuit is coupled to the second and fourth bit lines of the second data bit group for detecting voltage level on a selected one of the second and fourth memory cells and for applying the detected voltage level to the second data pin. The distances of the second sensing circuit to the second and fourth memory cells are substantially minimized and are substantially equal.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 2:
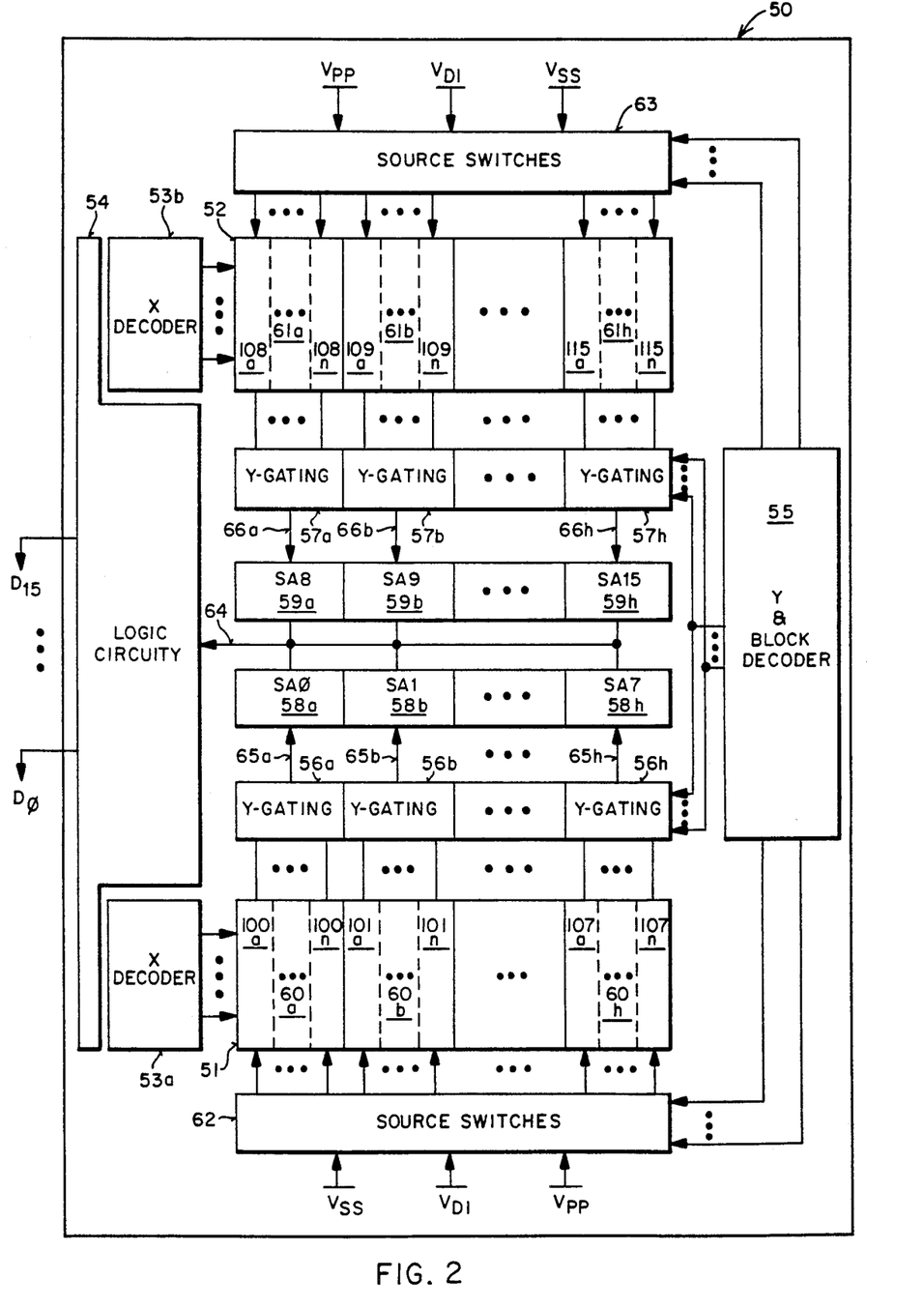
FIG. 2 is a physical layout block diagram of a flash EPROM, including two memory planes, wherein columns of memory cells corresponding to a data pin are grouped together to form a data bit group.

FIG. 2 illustrates in block diagram form the physical die layout of a flash EPROM 50, which implements a preferred embodiment of the present invention. Flash EPROM 50 includes a memory array that comprises a first memory plane 51 and a second memory plane 52. Each of first and second memory planes 51-52 is made up of electrically programmable and electrically erasable read-only memory cells that store data at addresses. For one embodiment, first and second memory planes 51-54 together can store 4 megabits ("Mbits") of data. For alternative embodiments, memory planes 51 and 52 together can store more or fewer than 4 Mbits of data. For example, first and second planes 51-52 together may store 8 Mbits of data.

For one embodiment, all circuitry of flash EPROM 50 resides on a single substrate, as shown in FIG. 2. For a further embodiment, flash EPROM 50 employs CMOS circuitry.

As described in more detail below, the memory array of flash EPROM 50 is organized into bit line blocks. Each block includes a plurality of sub-blocks, each being associated with one of data pins of flash EPROM 50. The sub-blocks associated with the same data pin are grouped together on the substrate to form a data bit group such that the lengths of the bit lines of each data bit group to their common sense amplifier are substantially minimized. In addition, the lengths of the bit lines of each data bit group to their common sense amplifier are substantially equal. The line impedances and line capacitances of the bit lines in each data bit group are therefore substantially minimized and equal, which helps to improve the total access time of flash EPROM 50.

Referring to FIG. 2, each of memory planes 51-52 includes a plurality of bit lines and word lines. Each of memory planes 51-52 also includes a number of source lines. Memory cells are formed at intersections of the word lines and the bit lines. Each of the word lines is coupled to the control gates of the memory cells along one row. Each of the bit lines is coupled to the drains of the memory cells along one column. Each of the source lines is coupled to the sources of a number of memory cells within each of memory planes 51 and 52. The configuration of each of memory planes 51 and 52 will be described in more detail below.

Flash EPROM 50 includes sixteen data pins $D_0$ through $D_{15}$. Data pins $D_0$–$D_{15}$ can couple word wide data (i.e., sixteen bits of data) to and from flash EPROM 50. Alternatively, flash EPROM 50 may include more or fewer than sixteen data pins $D_0$–$D_{15}$. For example, flash EPROM 50 may include eight data pins. For that eight bit pin embodiment, only byte wide data (i.e., eight bits of data) can be coupled to and from flash EPROM 50 via the eight data pins.

Flash EPROM 50 of FIG. 2 also includes a byte wide mode and a word wide mode. When flash EPROM 50 is in the byte wide mode, only half of data pins $D_0$–$D_{15}$ are providing or receiving data (i.e., eight bits) and the other half of data pins $D_0$–$D_{15}$ are left floating. When flash EPROM 50 is in the word wide mode, all data pins $D_0$–$D_{15}$ are providing or receiving data.

Each of data pins $D_0$–$D_{15}$ are associated with a plurality of bit lines in the memory array of flash EPROM 50. For each address applied at flash EPROM 50, each of data pins $D_0$–$D_{15}$ is coupled to a selected bit line of the associative bit lines of that data pin.

Each of memory planes 51-52 is organized into eight groups. As shown, plane 51 is organized into groups 60a through 60h and plane 52 is organized into groups 61a through 61h. Each of groups 60a-60h and 61a-61h includes a plurality of bit lines extending within that group. The bit lines within each group do not extend to adjacent groups. The bit lines within each of groups 60a-60h and 61a-61h are associated with a respective one of data pins $D_0$ through $D_{15}$ of flash EPROM 50. This means that each of groups 60a-60h and 61a-61h corresponds to one of data pins $D_0$–$D_{15}$. For example, data bit group 60a is associated with data pin $D_0$. Data bit group 61h is associated with data pin $D_{15}$.

The bit lines that are accessed by one address are not grouped together on the substrate of flash EPROM 50, but are instead distributed over the entire memory array of flash EPROM 50. All the bit lines of flash EPROM 50 that are associated with the same data pin are grouped together on the substrate of flash EPROM 50 to form each group. Each data pin can provide and receive one bit of data. Therefore, each of groups 60a-60h and 61a-61h is referred to as data bit group. Each of data bit groups 60a-60h and 61a-61h is responsible for coupling one bit of data to or from its respective one of data pins $D_0$–$D_{15}$. The structure of each of data bit groups 60a-60h and 61a-61h will be described in more detail below.

When addressed, each of the data bit groups 60a-60h and 61a-61h has one selected bit line coupled at a time to its respective one of data pins $D_0$–$D_{15}$. For one address applied at flash EPROM 50, one bit line in each of data bit groups 60a-60h and 61a-61h is selected. For another address applied at flash EPROM 50, another bit line in each of data bit groups 60a-60h and 61a-61h is selected. The bit lines that are associated with each address applied at flash EPROM 50 are not grouped together on the substrate of flash EPROM 50, but are instead distributed over the entire memory array of first and second planes 51 and 52. All the bit lines that are associated with the same data pin are grouped together to form each data bit group.

For alternative embodiments, flash EPROM 50 may include more or fewer than sixteen data bit groups. For example, for one alternative embodiment, flash EPROM 50 includes eight data bit groups and eight data pins, each data pin being associated with one of the eight data bit groups. The number of data bit groups of flash EPROM 50, however, needs to be equal to the number of the data pins.

The word lines of each of memory planes 51-52 extend over all data bit groups 60a-60h and 61a-61h within each memory plane. For example, the word lines in memory plane 51 extend over all data bit groups 60a-60h and the word lines in memory plane 52 extend over all data bit groups 61a-61h. Therefore, the word lines in plane 51 are shared by and are common to all data bit groups 60a-60h. The word lines in plane 52 are shared by and are common to all data bit groups 61a-61h. In functional terms, each of the word lines in memory plane 51 is connected to one of the word lines of memory plane 52. In other words, the word lines in memory plane 51 also extend to and are shared by all data bit groups 61a-61h in memory plane 52. This is done by having two identical X decoders 53a and 53b receiving the same X address at the same time, which will be described in detail below. Each of X decoders 53a-53b is coupled to the word lines in one of memory planes 51 and 52.

Each of data bit groups 60a-60h and 61a-61h cannot be individually addressed for read, programming, or erasure operations. Each of data bit groups 60a-60h and 61a-61h contributes one bit of data for each address applied to flash EPROM 50.

Figure 3:
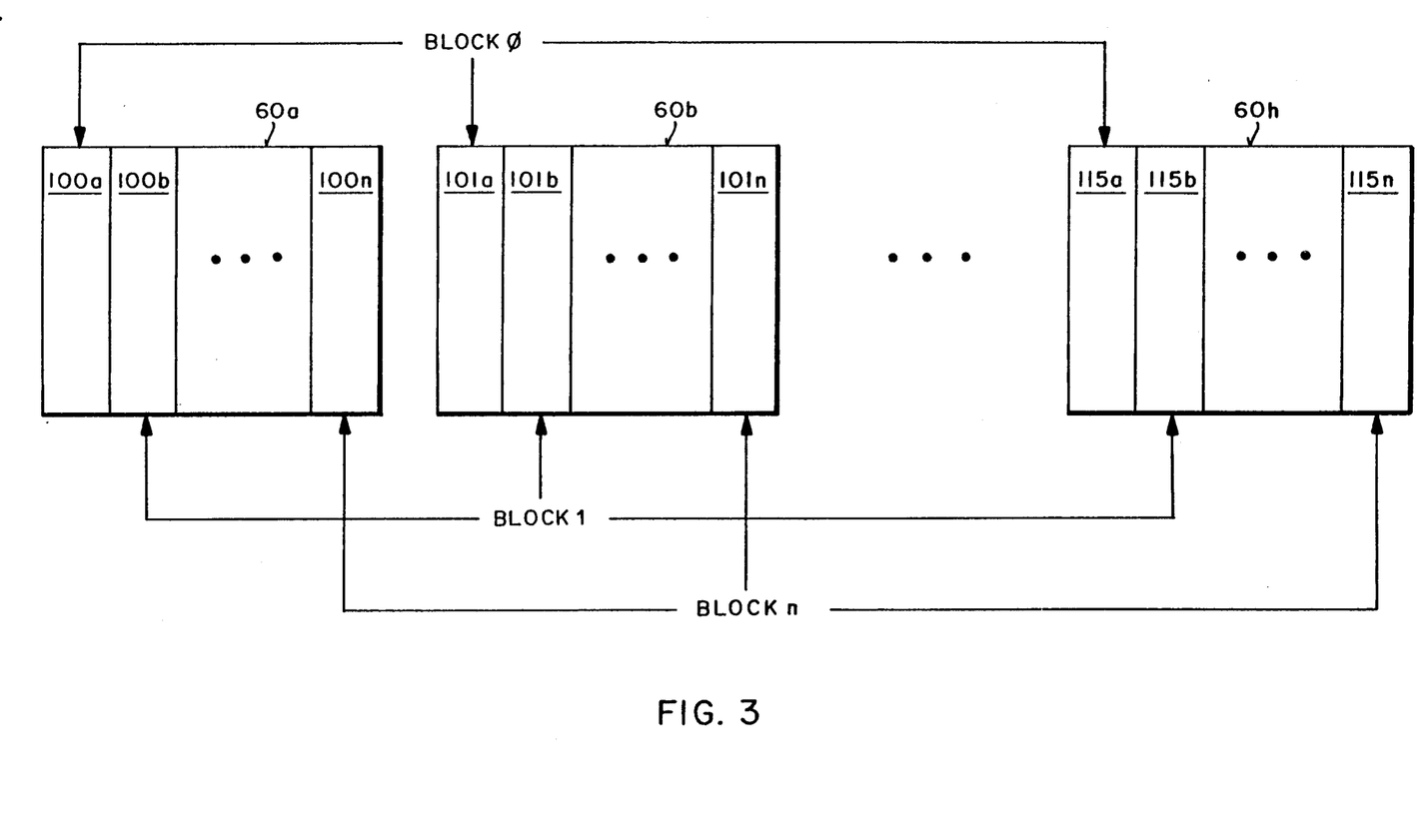
FIG. 3 is a block diagram of the blocks of the Flash EPROM.

As shown in FIG. 3, flash EPROM 50 also includes a plurality of blocks BLOCKo through BLOCKn. Blocks BLOCKo-BLOCKn are not physical blocks. Each of blocks BLOCKo-BLOCKn can be individually addressed for the read, programming, and erasure operations. Blocks BLOCKo-BLOCKn are bit line blocks. Each of blocks BLOCKo-BLOCKn includes a plurality of bit lines. Each block includes the bit lines that are addressed by a set of addresses applied at flash EPROM 50. The bit lines of a block are thus constructed to extend only within that block and are not shared by its adjacent blocks. The bit lines of a block are, however, not grouped physically together on the substrate of flash EPROM 50. The word lines, unlike the bit lines, are shared by and are common to all blocks. The configuration of each block will be described in detail below.

For one embodiment, blocks BLOCKo-BLOCKn include four main blocks, one boot block, and two parameter blocks. For alternative embodiments, flash EPROM 50 may include more or fewer than seven blocks. For example, for certain alternative embodiments, flash EPROM 50 may include four blocks or fourteen blocks.

The boot block of flash EPROM 50 stores, for example, program codes for system initialization and reprogramming algorithms. The boot block typically requires the least amount of updating. The parameter blocks are provided to allow the user to store frequently updated system parameters and configuration information.

Each of blocks BLOCKo-BLOCKn includes sixteen sub-blocks, each associated with one of data pins $D_0$-$D_{15}$. For example, BLOCKo includes sub-blocks 100a through 115a. BLOCK1 includes sub-blocks 100b through 115b. BLOCKn includes sub-blocks 100n through 115n. Sub-blocks 100a through 100n are located in data bit group 60a. Sub-blocks 101a through 101n are located in data bit group 60b. Sub-blocks 115a through 115n are located in data bit group 61h. Each of the sixteen sub-blocks of a block is located within one of data bit groups 60a-60h and 61a-61h that is associated with the same data pin. Therefore, each of blocks BLOCKo-BLOCKn is distributed over the entire memory planes 51 and 52 of flash EPROM 50 by its respective sub-blocks.

Each of the sixteen sub-blocks of a block includes all the bit lines of the block that are associated with one of data pins $D_0$-$D_{15}$. For example, sub-block 100a includes all the bit lines of BLOCKo that are associated with data pin $D_0$. Sub-block 100b includes all the bit lines of BLOCKo that are associated with data pin $D_1$. This means that all the bit lines of a block which are associated with the same data pin are grouped together on the substrate to form the sub-block of the block. Therefore, each of the sixteen sub-blocks within each of blocks BLOCKo-BLOCKn is referred to as data bit sub-block. The data bit sub-blocks in flash EPROM 50 each cannot be individually addressed for read, programming, and erasure operations. Whenever a block is a selected block, its sixteen sub-blocks are selected sub-blocks. For example, when BLOCKo is a selected block, sub-blocks 100a-115a are selected sub-blocks.

Referring back to FIG. 2, each of data bit groups 60a-60h and 61a-61h includes all the bit lines of flash EPROM 50 that are associated with a respective data pin. Therefore, each of the data bit groups 60a-60h and 61a-61h is formed by all the data bit sub-blocks of blocks BLOCKo-BLOCKn that are associated with the same one of data pins $D_0$-$D_{15}$. Thus, each of data bit groups 60a-60h and 61a-61h includes a plurality of data bit sub-blocks, each belonging to one of blocks BLOCKo-BLOCKn.

As shown in FIG. 2, data bit group 60a includes data bit sub-blocks 100a through 100n. Data bit group 60b includes data bit sub-blocks 101a through 101n and data bit group 61h includes data bit sub-blocks 115a through 115n. Data bit sub-blocks 100a-100n of data bit group 60a each has all its bit lines associated with data pin $D_0$. Data bit sub-blocks 101a-101n of data bit group 60b each has all its bit lines associated with data pin $D_1$ and data bit sub-blocks 115a-115n of data bit group 61h each has all its bit lines associated with data pin $D_{15}$.

Each of data bit sub-blocks in one data bit group belongs to one of blocks BLOCKo-BLOCKn. For example, each of data bit sub-blocks 100a-100n in data bit group 60a belongs to one of blocks BLOCKo-BLOCKn. Likewise, each of data bit sub-blocks 101a-101n in data bit group 60b belongs to one of blocks BLOCKo-BLOCKn. Each of blocks BLOCKo-BLOCKn includes one data bit sub-block in each of data bit groups 60a-60h and 61a-61h. For example, BLOCKo is formed by sub-blocks 100a through 115a in each of data bit groups 60a-60h and 61a-61h. BLOCKn is formed by sub-blocks 100n through 115n in each of data bit groups 60a-60h and 61a-61h.

Figure 4:
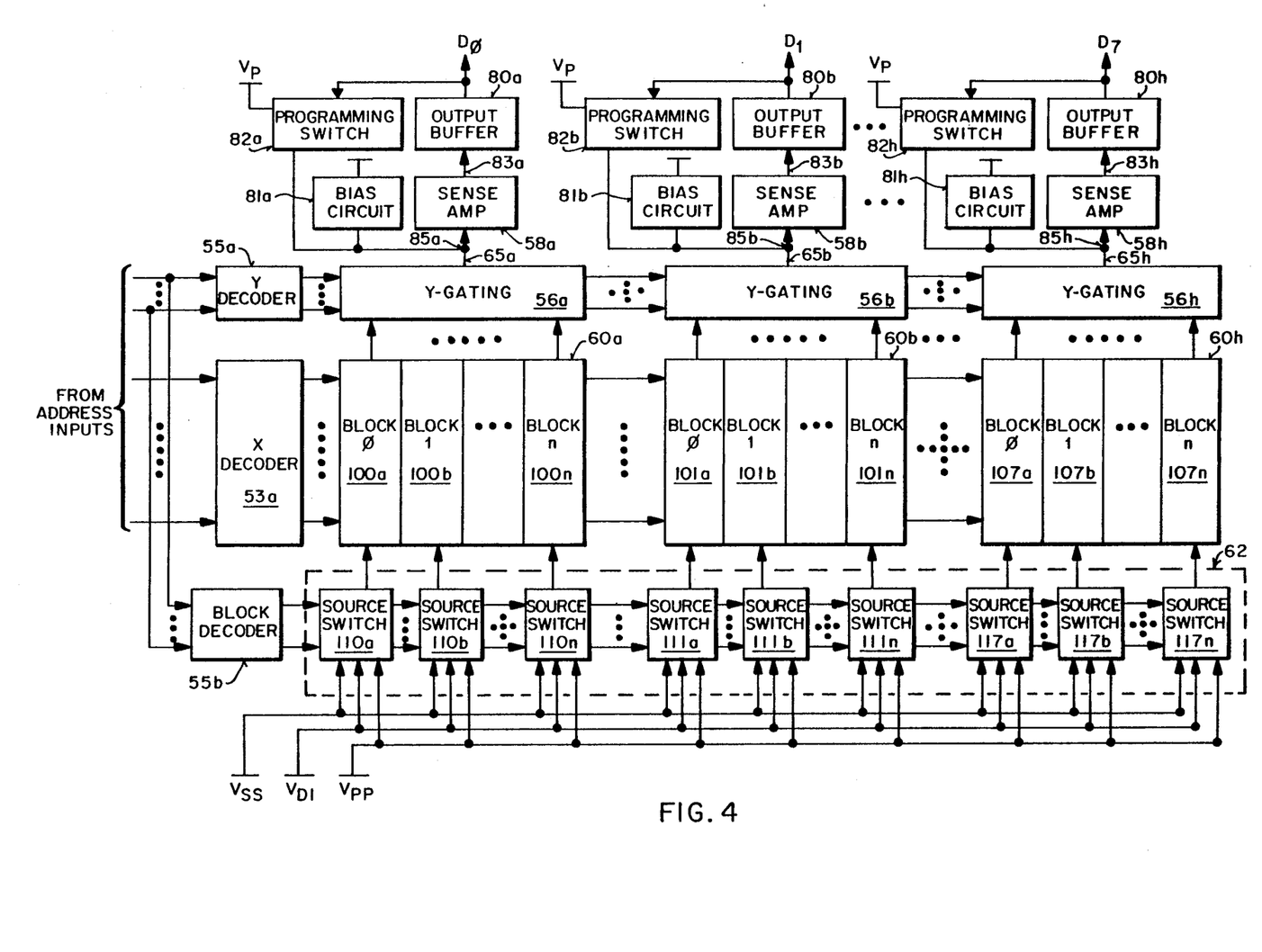
FIG. 4 is a block diagram of the layout of one of the memory planes of the flash EPROM of FIG. 2, showing blocks and data bit groups.

The number of the sub-blocks in each of data bit groups 60a-60h and 61a-61h is equal to the number of blocks BLOCKo-BLOCKn. FIG. 4 illustrates the configuration of each of data bit groups 60a-60h which will be described in more detail below. Data bit groups 61a-61h each has the same group configuration as that of each of data bit groups 60a-60h.

For alternative embodiments, each of blocks BLOCKo-BLOCKn may include more or fewer than sixteen data bit sub-blocks. For one alternative embodiment, flash EPROM 50 has eight data pins. For that embodiment, each of blocks BLOCKo-BLOCKn has eight data bit sub-blocks, each having its bit lines associated with one of the eight data pins.

Each data bit sub-block in each data bit group has its own common source line coupled to all memory cells within that sub-block. Therefore, each of blocks BLOCKo-BLOCKn includes sixteen source lines, each for one of the sixteen sub-blocks. In this situation, each of data bit groups 60a-60h and 61a-61h includes a number of source lines, each associated with one of the sub-blocks within that data bit group. The number of the source lines in each of data bit groups 60a-60h and 61a-61h equals the number of blocks BLOCKo-BLOCKn.

Flash EPROM 50 also includes (1) sixteen Y gating circuits 56a through 56h and 57a through 57h, and (2) sixteen sense amplifiers 58a through 58h and 59a through 59h. Each of Y gating circuits 56a-56h and 57a-57h is coupled to one of data bit groups 60a-60h and 61a-61h. Similarly, each of sense amplifiers 58a-58h and 59a-59h is associated with one of data bit groups 60a-60h and 61a-61h. This is due to the fact that each of data bit groups 60a-60h only corresponds to one of data pins $D_0$-$D_{15}$. Y gating circuits 56a-56h and 57a-57h each provides selective coupling of the bit lines of each of data bit groups 60a-60h and 61a-61h to its respective one of sense amplifiers 58a-58h and 59a-59h. Each of Y gating circuits 56a-56h and 57a-57h selectively couples one of the bit lines of its respective one of data bit groups 60a-60h and 61a-61h to its respective one of sense amplifiers 58a-58h and 59a-59h during the read operation of flash EPROM 50. For example, Y gating circuit 56a can selectively couple one of the bit lines within data bit group 60a to sense amplifier 58a. Y gating circuit 57a can selectively couple one of the bit lines of data bit group 61a to sense amplifier 59a. The outputs of sense amplifiers 58a-58h and 59a-59h are coupled to sixteen output buffers (not shown) inside logic circuitry 54 via data bus 64. The output of each of the output buffers is then applied to a respective one of data pins $D_0$ through $D_{15}$.

Each of Y gating circuits 56a-56h and 57a-57h may also couple a programming potential $V_P$ to the selected bit line of its respective data bit group during the programming operation via a programming switch (not shown in FIG. 2), which will be described in more detail below.

Because each of Y gating circuits 56a-56h and 57a-57h is coupled to one of data bit groups 60a-60h and 61a-61h and because each data bit group corresponds to one of data pins $D_0$-$D_{15}$, each of Y gating circuits 56a-56h and 57a-57h only selects one bit line for every Y address applied to flash EPROM 50. This means that each of Y gating circuits 56a-56h and 57a-57h requires only one connection line to connect to its associative one of sense amplifiers 58a-58h and 59a-59h. As shown in FIG. 2, Y gating circuit 56a is coupled to sense amplifier 58a via connection line 65a. Y gating circuit 56 is coupled to sense amplifier 58b via connection line 65b and Y gating circuit 57a is coupled to sense amplifier 59a via connection line 66a, etc. Each of sense amplifiers 58a-58h and 59a-59h can be placed very close to its respective one of Y gating circuits 56a-56h and 57a-57h, thus causing the length of each of connection lines 65a-65h and 66a-66h to be minimized.

Given that only one sense amplifier is required for each data bit group, no connection line is required to connect the bit lines of a data bit group to each of all other sense amplifiers. In addition, each of sense amplifiers 58a-58h can be placed close to its respective one of data bit groups 60a-60h and 61a-61h. Thus, the lengths of the bit lines in each of data bit groups 60a-60h and 61a-61h are substantially minimized and are substantially uniform. This causes the line impedance and line capacitance of each of the bit lines in each of data bit groups 60a-60h and 61a-61h to be accordingly minimized, which improves the total access time of flash EPROM 50.

Logic circuitry 54 of flash EPROM 50 includes other circuits besides the output buffers. For example, logic circuitry 54 can include write state circuitry and command state circuitry. The write state circuitry controls the sequences of the programming and erasure operations of flash EPROM 50. The command state circuitry decodes command received from external circuitry and generates the appropriate control signals to the write state circuitry.

Flash EPROM 50 also includes source switches 62 and 63. Source switches 62 comprise a plurality of source switches, each connected to the common source line of one of the data bit sub-blocks in each of data bit groups 60a-60h. Likewise, source switches 63 comprise a plurality of source switches, each connected to the common source line of one of the data bit sub-blocks in each of data bit groups 61a-61h. Each of the plurality of source switches 62 couples one of a ground potential $V_{SS}$, a disturb inhibit potential $V_{DI}$, and a programming/erasure potential $V_{PP}$ to the source of all cells within its respective data bit sub-block of each of data bit groups 60a-60h and 61a-61h as part of the read, programming, and erasure operations via the respective common source line. Each of the plurality of switches of source switches 62 and 63 may be ordinary switch that comprises a set of FET transistors.

Flash EPROM 50 includes two identical X decoders 53a and 53b, and a Y and block decoder 55. X decoder 53a is the row decoder for memory plane 51 and X decoder 53b is the row decoder for memory plane 52. Y and block decoder 55 is the column decoder and block selector for memory planes 51 and 52. Addresses are applied to decoders 53a-53b and 55.

X decoder 53a is coupled to the word lines of memory plane 51 and X decoder 53b is coupled to the word lines of memory plane 52. X decoders 53a and 53b receive the same X addresses at the same time. Therefore, X decoders 53a and 53b can be considered one X decoder and each of the word lines of first memory plane 51 is extended to connect to its associative one of the word lines in second memory plane 52. In other words, a word line is common to and is shared by all data bit groups 60a-60h and 61a-61h. X decoders 53a and 53b each selects one word line in accordance with each of the X addresses applied at both decoders 53a and 53b in one of read and programming operations. X decoders 53a-53b each may be any ordinary decoder available.

For an alternative embodiment, flash EPROM 50 includes one X decoder and each of the word lines of memory plane 51 are connected to one of the word lines in memory plane 52.

In FIG. 2, Y and block decoder 55 is coupled, via each of Y gating circuits 56a-56h and 57a-57h, to the bit lines of each of data bit groups 60a-60h and 61a-61h. Y and block decoder 55 receives the Y addresses of flash EPROM 50. Y and block decoder 55 selects a selected bit line from one data bit sub-block of each of data bit groups 60a-60h and 61a-61h for every Y address applied to undergo the read or programming operation. The sub-blocks of data bit groups 60a-60h and 61a-61h that include the selected bit lines are the selected sub-blocks. The selected sub-blocks in data bit groups 60a-60h and 61a-61h belong to one of blocks BLOCK₀-BLOCKn. In other words, for each Y address applied, one of blocks BLOCK₀-BLOCKn is a selected block. The selected bit lines of the selected block are distributed over all of data bit groups 60a-60h and 61a-61h of memory planes 51 and 52. For any given Y address, only one block is a selected block in flash EPROM 50. Y and block decoder 55 causes Y gating circuits 56a-56h and 57a-57h to connect the selected bit lines of the selected sub-blocks in each of data bit groups 60a-60h and 61a-61h to sense amplifiers 58a-58h and 59a-59h, respectively, during the read operation. Y and block decoder 55 causes Y gating circuits 56a-56h and 57a-57h to connect the selected bit lines for the selected sub-blocks in each of data bit groups 60a-60h and 61a-61h to the programming switches, respectively, during the programming operation. Y and block decoder 55 may be any ordinary decoder.

For an alternative embodiment, Y and block decoder 55 may select one byte of bit lines from either data bit groups 60a-60h or data bit groups 61a-61h for each Y address applied. For this alternative embodiment, flash EPROM 50 is in the byte wide mode. An additional signal is required to cause Y and block decoder 55 to select the selected bit lines from either plane 51 or plane 52.

Y and block decoder 55 is also coupled to source switches 62 of plane 51 and source switches 63 of plane 52. Y and block decoder 55 selects one of blocks BLOCK₀-BLOCKn by selecting the associative source switches of all the sub-blocks of the selected block for any Y address applied. Again, for any given Y address, only one block is a selected block. The block decoding function of decoder 55 comes from an intermediate decoding stage of the Y decoding for selecting the bit lines in the selected block. This is because only a subset of the Y address is required to determine which block is the selected block and conversely which blocks are not selected. Y and block decoder 55 may include two separate decoders.

Y and block decoder 55 selects the source switches associated with one of blocks BLOCK₀-BLOCKn of memory planes 51 and 52 to couple one of $V_{SS}$, $V_{DI}$, and $V_{PP}$ potentials to the sources of the cells within selected block and one of the $V_{SS}$, $V_{DI}$, and $V_{PP}$ potentials to the sources of the cells within the unselected blocks during one of the read, programming, and erasure operations, which will be described below.

For one embodiment, $V_{PP}$ is approximately 12 volts and $V_{DI}$ is approximately 3.5 volts. For another embodiment, $V_{DI}$ is approximately 2 volts. The purpose of having the disturb inhibit potential is to apply the $V_{DI}$ potential to the sources of memory cells in unselected blocks during programming to prevent the cells along a selected word line in the unselected blocks to be programmed. The $V_{DI}$ potential is low enough to prevent erasing of memory cells along unselected word lines in unselected blocks and yet high enough to prevent programming of cells along the selected word line of the unselected blocks.

Initially, the entire flash EPROM 50 of FIG. 2 is erased before being programmed to store data at addresses. After initial programming, flash EPROM 50 can be read, erased, and reprogrammed. It is expected that one of blocks BLOCKo-BLOCKn may be selected for reprogramming after initial programming. Only the block or blocks requiring reprogramming are erased and reprogrammed.

During the read operation of flash EPROM 50, X decoders 53a and 53h receives an X address to select one word line of the memory array of planes 51 and 52. Y and block decoder 55 receives a Y address to select one bit line from a selected sub-block in each of data bit groups 60a-60h and 61a-61h. Therefore, a word of bit lines are selected for each Y address applied. Y and block decoder 55 selects the selected bit lines from data bit groups 60a-60h and 61a-61h via each of Y gating circuits 56a-56h and 57a-57h. For any given Y address applied, each of data bit groups 60a-60h and 61a-61h has a selected sub-block that includes the selected bit line of the data bit group. The selected sub-blocks in all of data bit groups 60a-60h and 61a-61h form the selected block. The selected bit lines each is connected to its respective one of sense amplifiers 58a-58h and 59a-59h via its respective one of connection lines 65a-65h and 66a-66h. For example, the selected bit line from data bit group 60a is coupled to sense amplifier 58a via Y gating circuit 56a and connection line 65a. The selected bit line from data bit group 60b is coupled to sense amplifier 58b via Y gating circuit 56b and connection line 65b.

Y and block decoder 55 also selects the source switches of source switches 62 and 63 that are associated with the selected sub-blocks of the selected block in all of data bit groups 60a-60h and 61a-61h to couple the $V_{SS}$ potential to the source of all the cells of the selected block. Memory cells at intersections of the selected word line and the selected bit lines are the selected cells. A read voltage of approximately 5 volts is maintain on the selected word line. A potential of approximately one volt is maintained on the selected bit lines. Sense amplifiers 58a-58h and 59a-59h then read out the data stored in the selected cells via the selected bit lines. Whether a selected cell stores a logical high or logical low bit information is determined by the conductivity of the cell. Sense amplifiers 58a-58h and 59a-59h then apply the data read from the selected cells to the output buffers located in logic circuitry 54 via data bus 64. Data bus 64 has sixteen data lines, each coupled to one of sense amplifiers 58a-58h and 59a-59h.

When flash EPROM 50 is in the byte wide mode, Y and block decoder 55 selects one byte of selected bit lines from either memory plane 51 or memory plane 52. In this situation, only half of sense amplifiers 58a-58h and 59a-59h read the byte wide data from the selected bit lines.

During the programming operation, X decoders 53a and 53b receive an X address to select a word line of the memory array of memory planes 51 and 52. Y and block decoder 55 receives a Y address to select a bit line from a selected sub-block in each of data bit groups 60a-60h and 61a-61h. Y and block decoder 55 does so via each of Y gating circuits 56a-56h and 57a-57h. For any given Y address, each of data bit groups 60a-60h and 61a-61h has a selected sub-block that includes the selected bit line of that data bit group. The selected sub-blocks in all of the data bit groups constitute the selected block.

Y and block decoder 55 also selects the source switches of source switches 62 and 63 that are associated with the selected sub-blocks of the selected block. The programming potential $V_{PP}$ is applied to the selected word line and a programming potential $V_P$ is selectively applied to each of the selected bit lines via one of the programming switches. Whether the $V_P$ potential is applied to a particular selected bit line depends on the data applied to the associative one of data pins $D_0-D_{15}$. For example, when data pin $D_0$ receives a logical low data bit, the selected bit line in data bit group 60a is applied with the $V_P$ potential. For one embodiment, the $V_P$ potential is approximately 7 volts.

Meanwhile, the selected source switches for the selected sub-blocks of the selected block in each of data bit groups 60a-60h and 61a-61h couple the $V_{SS}$ potential to the sources of the cells in the selected block and the source switches of switches 62 and 63 for the unselected sub-blocks of the unselected blocks couple the $V_{DI}$ potential to the sources of the memory cells in all the unselected blocks to prevent the memory cells along the selected word line in the unselected blocks from being disturbed by the programming of the selected memory cells in the selected block along the selected word line.

During the block erasure operation, Y and block decoder 55 receives a Y address to select source switches for all the sub-blocks of a selected block. The Y decoding function of Y and block decoder 55 is disabled. The selected source switches of source switches 62 and 63 then couple the erasure potential $V_{PP}$ to the sources of all cells within all the selected sub-blocks of the selected block. X decoders 53a-53b couple a ground potential to all word lines of memory planes 51 and 52. The bit lines of the selected block are allowed to float during the block erasure operation.

FIG. 4 illustrates in block diagram form the configuration of first memory plane 51 and its associated circuits in more detail. The configuration of second memory plane 52 and its associated circuits is identical to that of memory plane 51 and its associated circuits.

In FIG. 4, each of data bit groups 60a-60h has a plurality of data bit sub-blocks, each belonging to one of blocks BLOCKo-BLOCKn. For example, sub-block 100a of data bit group 60a belongs to BLOCKo and sub-block 100n of data bit group 60a belongs to BLOCKn. Similarly, sub-block 107a of data bit group 60h belongs to BLOCKo and sub-block 107n of data bit group 60h belongs to BLOCKn. Each of the sub-blocks in each of data bit groups 60a-60h is associated with one of source switches 62. As shown, source switches 62 include switches 110a through 110n, each associated with one of sub-blocks 100a-100n of data bit group 60a. Source switches 62 also include switches 111a through 111n, each associated with one of sub-blocks 101a-101n of data bit group 60b. In addition, switches 117a-117n of source switches 62 each is associated with one of sub-blocks 107a-107n of data bit group 60h. A block decoder 55b is coupled to source switches 62. Block decoder 55b is part of Y and block decoder 55 of FIG. 2. Y and block decoder 55 of FIG. 2 also includes a Y decoder 55a. Block decoder 55b selects one source switch from switches 110a-110n, 111a-111n, etc., through 117a-117n, respectively, for each Y (i.e., block) address applied. For example, when BLOCKo is a selected block, block decoder 55b selects source switches 110a, 111a, etc., through 117a in memory plane 51 to couple one of the $V_{SS}$, $V_{DI}$, and $V_{PP}$ potentials to selected sub-blocks 100a, 101a, etc., through 107a of selected block BLOCKo in each of data bit group 60a-60h of memory plane 51.

As also shown in FIG. 4, each of data bit groups 60a-60h has its bit lines coupled to its respective one of Y gating circuits 56a-56h. Each of Y gating circuits 56a-56h provides selective coupling to its bit lines and selects a selected bit line from its respective one of data bit group 60a-60h. Each of Y gating circuits 56a-56h is controlled by Y decoder 55a. Each Y gating circuit selects the selected bit line from one of the sub-blocks in its respective data bit group. Each Y gating circuit then couples the selected bit line from its respective data bit group to its associative bias circuit and sense amplifier during the read operation. Each Y gating circuit couples the selected bit line from its respective data bit group to its associative programming switch during the programming operation. For example, during the read operation, Y gating circuit 56a couples the selected bit line from data bit group 60a to sense amplifier 58a and bias circuit 81a via line 65a. The output of sense amplifier 58a is then applied to data pin $D_0$ via output buffer 80a ad via line 83a. During programming operation, Y gating circuit 56a couples the selected bit line from data bit group 60a to programming switch 82a via line 65a. Programming switch 82a selectively applies the $V_P$ potential to the selected bit line of data bit group 60a depending upon the data applied on data pin $D_0$.

Figure 5:
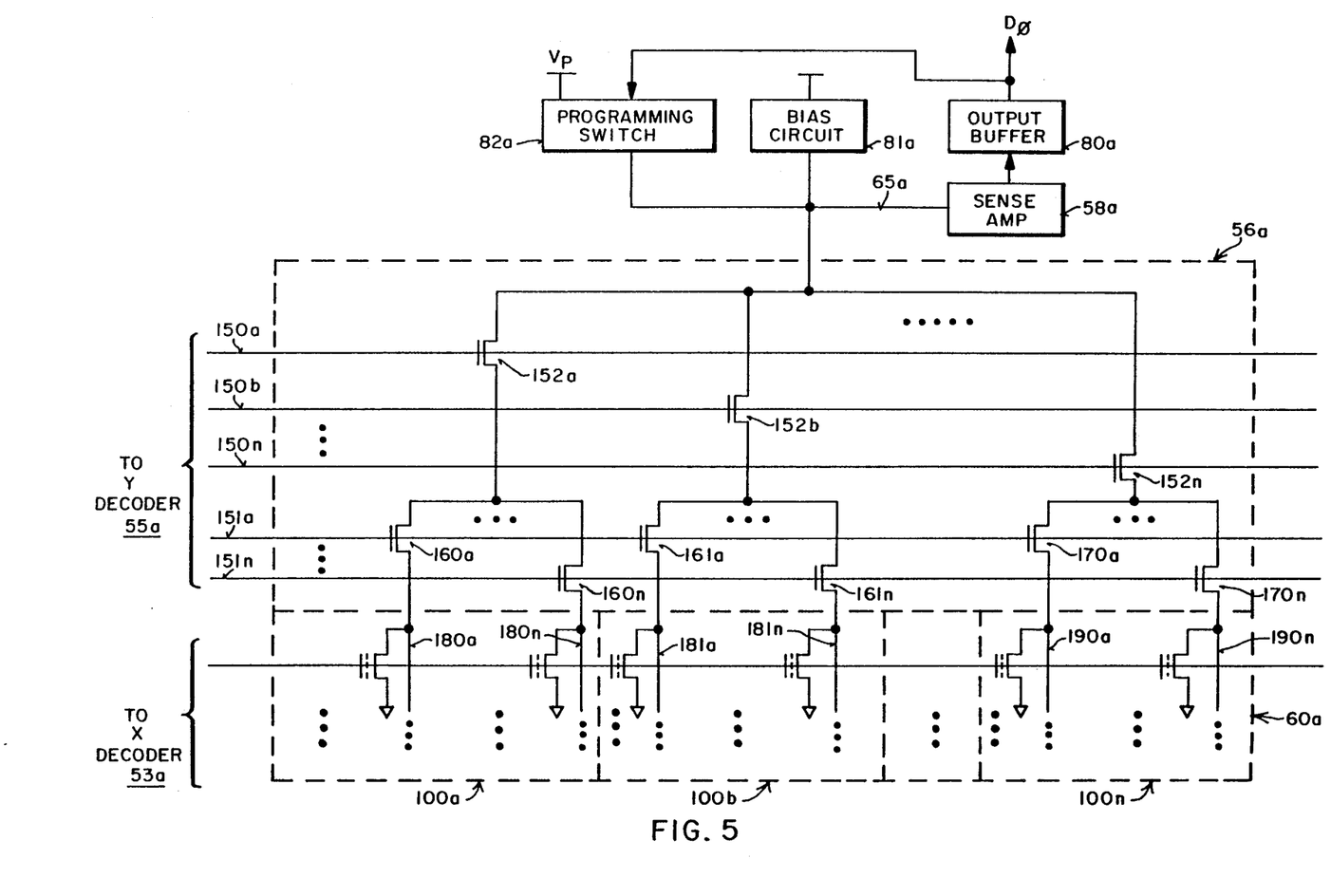
FIG. 5 is a block diagram of the layout of one data bit group of FIG. 4.

FIG. 5 illustrates the configuration of Y gating circuit 56a for data bit group 60a of FIGS. 2-4. Y gating circuits 56b and 56h and 57a-57h each has the same circuit configuration as that of Y gating circuit 56a. In FIG. 5, Y gating circuit 56a includes sub-block select transistors 152a through 152n, each associated with one of sub-blocks 100a-100n. For example, transistor 152a is the sub-block select transistor for sub-block 100a. Transistor 152n is the sub-block select transistor for sub-block 100b and transistor 152n is the sub-block select transistor for sub-block 100n.

Y gating circuit 56a also includes a plurality of column select transistors, each coupled to a bit line of one of sub-blocks 100a-100n of data bit group 60a. For example, transistor 160a is the column select transistor for bit line 180a of sub-block 100a. Transistor 170a is the column select transistor for bit line 190a of sub-block 100n.

Lines 150a through 150n are coupled to the gate of transistors 152a-152n, respectively. Lines 151a through 151n are coupled to the gates of transistors 160a-160n, 161a-161n, etc., through 170a-170n, respectively. For example, line 151a is coupled to the gates of transistors 160a, 161a, etc., through 170a and line 151n is coupled to the gates of transistors 160n, 161n, etc., through 170n. Lines 150a-150n and 151a-151n are coupled to Y decoder 55a of FIG. 4. Lines 150a-150n and 151a-151n extend to all Y gating circuits 56a-56h and 57a-57n of FIG. 2. Each of lines 150a-150n is coupled to the gates of the sub-block select transistors in all Y gating circuits 56a-56h and 57a-57h that are associated with the sub-blocks of one of blocks BLOCKo-BLOCKn. For example, line 150a is coupled to the gates of the sub-block selected transistors of the sub-blocks of BLOCKo in all Y gating circuits 56a-56h and 57a-57h. Line 150n is coupled to the gates of the sub-block select transistors of the sub-blocks of BLOCKn in all Y gating circuits 56a-56h and 57a-57h.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A nonvolatile memory device residing on a substrate, comprising:
   (A) a first block that comprises
      (a) a first sub-block associated with a first data pin of the memory device, comprising
         (1) a first memory cell;
         (2) a first bit line coupled to a drain of the first memory cell;
         (3) a first source line coupled to a source of the first memory cell;
      (b) a second sub-block associated with a second data pin of the memory device, comprising
         (1) a second memory cell;
         (2) a second bit line coupled to a drain of the second memory cell;
         (3) a second source line coupled to a source of the second memory cell;
   (B) a second block that comprises
      (a) a third sub-block associated with the first data pin, comprising
         (1) a third memory cell;
         (2) a third bit line coupled to a drain of the third memory cell;
         (3) a third source line coupled to a source of the third memory cell;
      (b) a fourth sub-block associated with the second data pin, comprising
         (1) a fourth memory cell;
         (2) a fourth bit line coupled to a drain of the fourth memory cell;
         (3) a fourth source line coupled to a source of the fourth memory cell, wherein the first sub-block of the first block and the third sub-block of the second block are grouped together on the substrate to form a first data bit group corresponding to the first data pin, wherein the second sub-block of the first block and the fourth sub-block of the second block are grouped together on the substrate to form a second data bit group corresponding to the second data pin;
   (C) a word line coupled to control gates of the first, second, third, and fourth memory cells;
   (D) first sensing means coupled to the first and third bit lines of the first data bit group for detecting voltage level on a selected one of the first and third bit lines and for applying the detected voltage level to the first data pin, wherein the distances of the first sensing means to the first and third memory cells are substantially minimized and are substantially equal;

(E) second sensing means coupled to the second and fourth bit lines of the second data bit group for detecting voltage level on a selected one of the second and fourth bit lines and for applying the detected voltage level to the second data pin, wherein the distances of the second sensing means to the second and fourth memory cells are substantially minimized and are substantially equal.

2. The nonvolatile memory device of claim 1, wherein the first, second, third, and fourth memory cells are electrically erasable and electrically programmable read-only memory cells.

3. The nonvolatile memory device of claim 1, further comprising:
(i) first source switching means for coupling one of a first potential, a second potential, and a third potential to the first and second source lines of the first block at a time; and
(ii) second source switching means for coupling one of the first, second, and third potentials to the third and fourth source lines of the second block at a time.

4. The nonvolatile memory device of claim 3, wherein the first potential is a ground potential, wherein the second potential is a disturb inhibit potential, and wherein the third potential is a programming potential.

5. The nonvolatile memory device of claim 3, further comprising decoding means coupled to receive an address for causing the first source switching means to selectively couple one of the first, second, and third potentials to the first and second source lines of the first block, and for causing the second source switching means to selectively couple one of the first, second, and third potentials to the third and fourth source lines of the second block.

6. The nonvolatile memory device of claim 5, wherein the first source switching means further comprises a first source switch corresponding to the first sub-block and a second source switch corresponding to the second sub-block, wherein the second source switching means further comprises a third source switch corresponding to the third sub-block and a fourth source switch corresponding to the fourth sub-block.

7. The nonvolatile memory device of claim 5, wherein the decoding means comprises a block decoder.

8. The nonvolatile memory device of claim 5, wherein the decoding means also selects (1) one of the first and third bit lines, and (2) one of the second and fourth bit lines, wherein when the decoding means selects the first bit line in the first data bit group, the decoding means also selects the second bit line in the second data bit group, wherein when the decoding means selects the third bit line in the first data bit group, the decoding means also selects the fourth bit line in the second data bit group.

9. The nonvolatile memory device of claim 8, wherein during reading when the decoding means selects the first bit line in the first data bit group to couple to the first sensing means, the decoding means also selects the second bit line in the second data bit group to couple to the second sensing means, wherein during reading when the decoding means selects the third bit line in the first bit group to couple to the first sensing means, the decoding means also selects the fourth bit line in the second data bit group to couple to the second sensing means.

10. The nonvolatile memory device of claim 8, wherein when the decoding means selects the first block for programming, the decoding means also selects (1) the first source switching means to couple the first potential to the first and second source lines of the first block, and (2) the second source switching means to couple the second potential to the third and the fourth source lines of the second block, wherein when the decoding means selects the first bit line for erasing, the decoding means also selects (1) the first source switching means to couple the third potential to the first and second source lines of the first block, and (2) the second source switching means to couple the first potential to the third and the fourth source lines of the second block.

11. A nonvolatile memory device residing on a substrate, comprising:
(A) a first block that comprises
  (a) a first sub-block associated with a first data pin of the memory device, comprising
    (1) a first memory cell;
    (2) a first bit line coupled to a drain of the first memory cell;
    (3) a first source line coupled to a source of the first memory cell;
  (b) a second sub-block associated with a second data pin of the memory device, comprising
    (1) a second memory cell;
    (2) a second bit line coupled to a drain of the second memory cell;
    (3) a second source line coupled to a source of the second memory cell;
(B) a second block that comprises
  (a) a third sub-block associated with the first data pin, comprising
    (1) a third memory cell;
    (2) a third bit line coupled to a drain of the third memory cell;
    (3) a third source line coupled to a source of the third memory cell;
  (b) a fourth sub-block associated with the second data pin, comprising
    (1) a fourth memory cell;
    (2) a fourth bit line coupled to a drain of the fourth memory cell;
    (3) a fourth source line coupled to a source of the fourth memory cell, wherein the first sub-block of the first block and the third sub-block of the second block are grouped together on the substrate to form a first data bit group corresponding to the first data pin, wherein the second sub-block of the first block and the fourth sub-block of the second block are grouped together on the substrate to form a second data bit group corresponding to the second data pin;
(C) a word line coupled to control gates of the first, second, third, and fourth memory cells;
(D) first sensing means coupled to the first and third bit lines of the first data bit group for detecting voltage level on a selected one of the first and third bit lines and for applying the detected voltage level to the first data pin, wherein the distances of the first sensing means to the first and third memory cells are substantially minimized and are substantially equal;

(E) second sensing means coupled to the second and fourth bit lines of the second data bit group for detecting voltage level on a selected one of the second and fourth bit lines and for applying the detected voltage level to the second data pin, wherein the distances of the second sensing means to the second and fourth memory cells are substantially minimized and are substantially equal;

(F) first source switching means coupled to the first and second source lines of the first block for selectively coupling one of a first potential, a second potential, and a third potential to the first block at a time;

(G) second source switching means coupled to the third and fourth source lines of the second block for selectively coupling one of the first, second, and third potentials to the second block at a time.

12. The nonvolatile memory device of claim 11, wherein the first potential is zero volts, wherein the second potential is approximately 2 volts, and wherein the third potential is approximately 12 volts.

13. The nonvolatile memory device of claim 11, wherein the first, second, third, and fourth memory cells are electrically erasable and electrically programmable read-only memory cells.

14. The nonvolatile memory device of claim 11, further comprising decoding means coupled to receive an address for causing the first source switching means to selectively couple one of the first, second, and third potentials to the first and second source lines of the first block, and for causing the second source switching means to selectively couple one of the first, second, and third potentials to the third and fourth source lines of the second block.

15. The nonvolatile memory device of claim 14, wherein the first source switching means further comprises a first source switch corresponding to the first sub-block and a second source switch corresponding to the second sub-block, wherein the third source switching means further comprises a third source switch corresponding to the second sub-block and a fourth source switch corresponding to the fourth sub-block.

16. The nonvolatile memory device of claim 14, wherein the decoding means comprises a block decoder.

17. The nonvolatile memory device of claim 14, wherein the decoding means selectively couples (1) one of the first and third bit lines to the first sensing means, and (2) one of the second and fourth bit lines to the second sensing means, wherein when the decoding means selects the first bit line in the first data bit group, the decoding means also selects the second bit line in the second data bit group, wherein when the decoding means selects the third bit line in the first data bit group, the decoding means also selects the fourth bit line in the second data bit group.

18. The nonvolatile memory device of claim 17, wherein during reading when the decoding means selects the first bit line in the first data bit group to couple to the first sensing means, the decoding means also selects the second bit line in the second data bit group to couple to the second sensing means, wherein during reading when the decoding means selects the third bit line in the first data bit group to couple to the first sensing means, the decoding means also selects the fourth bit line in the second output data bit to couple to the second sensing means.

19. The nonvolatile memory device of claim 17, wherein when the decoding means selects the first block for programming, the decoding means also selects (1) the first source switching means to couple the first potential to the first and second source lines of the first block, and (2) the second source switching means to couple the second potential to the third and the fourth source lines of the second block, wherein when the decoding means selects the first block for erasing, the decoding means also selects (1) the first source switching means to couple the third potential to the first and second source lines of the first block, and (2) the second source switching means to couple the first potential to the third and the fourth source lines of the second block.

* * * * *

UNITED STATES PATENT AND TRADEMARK OFFICE
CERTIFICATE OF CORRECTION

PATENT NO. : 5,267,196
DATED : November 30, 1993
INVENTOR(S) : Sanjay S. Talreja, Peter K. Hazen, Sherif R. B. Sweha It is certified that error appears in the above-indentified patent and that said Letters Patent is hereby corrected as shown below:

Column 11; Line 55; Delete "maintain"; Insert in place thereof--maintained--

Signed and Sealed this

Twenty-sixth Day of September, 1995

*Attest:*

BRUCE LEHMAN

*Attesting Officer*     *Commissioner of Patents and Trademarks*